(12) United States Patent
Walda et al.

(10) Patent No.: US 12,058,809 B2
(45) Date of Patent: Aug. 6, 2024

(54) CONTROL UNIT FOR A MOTOR VEHICLE AND METHOD FOR PRODUCING AND MEASURING THE TIGHTNESS OF A CONTROL UNIT

(71) Applicant: Vitesco Technologies Germany GMBH, Hannover (DE)

(72) Inventors: Christian Walda, Forchheim (DE); Johannes Brunner, Erlangen (DE); Johannes Bock, Kirchensittenbach (DE); Karin Beart, Lauf an der Pegnitz (DE); Jens Heinrich, Sinzing (DE)

(73) Assignee: Vitesco Technologies Germany GmbH, Regensburg (DE)

( * ) Notice: Subject to any disclaimer, the term of this patent is extended or adjusted under 35 U.S.C. 154(b) by 223 days.

(21) Appl. No.: 17/654,350

(22) Filed: Mar. 10, 2022

(65) Prior Publication Data
US 2022/0201847 A1    Jun. 23, 2022

Related U.S. Application Data

(63) Continuation of application No. PCT/EP2020/074331, filed on Sep. 1, 2020.

(30) Foreign Application Priority Data

Sep. 11, 2019   (DE) .................... 10 2019 213 892.6
Sep. 17, 2019   (DE) .................... 10 2019 214 149.8

(51) Int. Cl.
*H05K 1/02*    (2006.01)
*H05K 1/18*    (2006.01)
*H05K 3/28*    (2006.01)

(52) U.S. Cl.
CPC ........... *H05K 1/0268* (2013.01); *H05K 1/181* (2013.01); *H05K 3/28* (2013.01); *H05K 2203/1327* (2013.01)

(58) Field of Classification Search
CPC ........ H05K 1/0268; H05K 1/181; H05K 3/28; H05K 2203/1327
(Continued)

(56) References Cited

U.S. PATENT DOCUMENTS

2006/0281230 A1   12/2006  Brandenburg et al.
2015/0303556 A1*  10/2015  Flores-Cuadras ........ H01Q 1/38
                                                343/893

FOREIGN PATENT DOCUMENTS

DE           4335879 A1    4/1995
DE       202015100678 U1    2/2015
(Continued)

OTHER PUBLICATIONS

International Search Report and Written Opinion dated Nov. 30, 2020 from corresponding International Patent Application No. PCT/EP2020/074331.

*Primary Examiner* — Andargie M Aychillhum

(57) ABSTRACT

A control unit for a motor vehicle is provided. The control unit includes a printed circuit board having a first side and an edge. The first side is delimited by the edge. At least one electronic component is arranged on the first side of the printed circuit board and is electrically conductively connected to the printed circuit board. At least one first conductor loop is arranged on the first side of the printed circuit board and at least one second conductor loop is arranged at a distance from the first conductor loop. The first conductor loop is arranged between the edge and the second conductor loop, and the second conductor loop is arranged between the first conductor loop and the at least one electronic component. An encapsulation surrounds at least the first side, the at least one electronic component, the first conductor loop and the second conductor loop.

10 Claims, 3 Drawing Sheets

(58) Field of Classification Search
USPC .......................................................... 361/760
See application file for complete search history.

(56) References Cited

FOREIGN PATENT DOCUMENTS

| | | | | |
|---|---|---|---|---|
| DE | 202017106142 U1 | * | 2/2019 | |
| JP | 2005236586 A | * | 9/2005 | |
| WO | WO-2007004401 A1 | * | 1/2007 | ....... G06K 19/07749 |

* cited by examiner

CONTROL UNIT FOR A MOTOR VEHICLE AND METHOD FOR PRODUCING AND MEASURING THE TIGHTNESS OF A CONTROL UNIT

CROSS-REFERENCE TO RELATED APPLICATIONS

This application claims the benefit of PCT Application PCT/EP2020/074331, filed Sep. 1, 2020, which claims priority to German Application 10 2019 214 149.8, filed Sep. 17, 2019 and German Application 10 2019 213 892.6, filed Sep. 11, 2019. The disclosures of the above applications are incorporated herein by reference.

TECHNICAL FIELD

The disclosure relates to a control unit for a motor vehicle. The control unit has an encapsulated or overmolded printed circuit board and a plurality of conductor loops are formed on the printed circuit board. An insulation resistance between the conductor loops can be measured to detect the tightness or the adhesive bond between the encapsulation and the printed circuit board.

BACKGROUND

Control units which have a housing are known, and a printed circuit board is arranged inside the housing. Control units of this kind can exhibit increased tightness owing to the housing. In the course of weight savings and to reduce component dimensions, control units or their printed circuit boards are generally encapsulated with a plastic and are therefore also designed to be media-tight to external influences. However, if the adhesive bond between the printed circuit board and the encapsulation weakens, a gap can form between the printed circuit board and the encapsulation. A corrosive medium, for example an oil, can enter through this gap and damage contacts of the electronic components which are arranged on the printed circuit board, as a result of which the control unit can suddenly and unexpectedly fail. A reduced adhesive bond between the printed circuit board and the encapsulation therefore must be avoided and established as early as possible. A particular aim is to monitor the adhesive bond between the encapsulation and the printed circuit board as early as during production of the control units, so that no control units with a reduced adhesive bond between the encapsulation and the printed circuit board are shipped.

SUMMARY

The disclosure provides a control unit for a motor vehicle which has a secure adhesive bond between an encapsulation and the printed circuit board and/or to provide a method with which a reduced adhesive bond between the encapsulation and the printed circuit board can be determined and/or ascertained as early as during the production process for the control unit.

One aspect of the disclosure provides a control unit for a motor vehicle. The control unit includes a printed circuit board having a first side and an edge. The first side of the printed circuit board is delimited by the edge. At least one electronic component is arranged on the first side of the printed circuit board and is electrically conductively connected to the printed circuit board. At least one first conductor loop is arranged on the first side of the printed circuit board, and at least one second conductor loop is arranged at a distance from the first conductor loop. The first conductor loop is arranged between the edge and the second conductor loop, and the second conductor loop is arranged between the first conductor loop and the at least one electronic component. The control unit also includes an encapsulation of the printed circuit board, where the encapsulation surrounds at least the first side, the at least one electronic component, the first conductor loop and the second conductor loop.

Implementations of the disclosure may include one or more of the following optional features. In some implementations, the control unit has at least one printed circuit board. The printed circuit board has a first side. The first side is may also be referred to as the top side. The printed circuit board additionally has an edge which delimits the first side of the printed circuit board. The edge can therefore also be referred to as a border. The edge represents an outer termination of the outer printed circuit board.

At least one electronic component is arranged on the first side of the printed circuit board and is electrically conductively connected to the printed circuit board. The first side of the printed circuit board generally has a plurality of electronic components which are arranged at a distance from one another on the first side. The electronic components are usually also referred to as electronic modules.

Furthermore, at least a first conductor loop and a second conductor loop which is arranged at a distance from the first conductor loop are arranged on the first side of the printed circuit board. The first conductor loop and the second conductor loop are arranged at a distance from one another in a direction parallel to the plane of the printed circuit board. The first conductor loop is formed between the edge of the printed circuit board and the second conductor loop. The second conductor loop is arranged between the first conductor loop and the at least one electronic component. Accordingly, both the first conductor loop and the second conductor loop are arranged between the edge of the printed circuit board and the electronic component.

In addition, the first side of the printed circuit board is encapsulated. The encapsulation of the printed circuit board is also referred to as "overmolding". The encapsulation is formed in such a way that it surrounds at least the electronic component, the first conductor loop and the second conductor loop. If the adhesive bond between the encapsulation and the first side of the printed circuit board is reduced, a small gap can form between the encapsulation and the printed circuit board. If the control unit is then immersed in a conductive medium, for example an electrolyte, the electrically conductive medium can enter the gap and provide an electrically conductive connection between the first conductor loop and the second conductor loop, so that the insulation resistance between the first conductor loop and the second conductor loop is reduced. It is also conceivable that, for example, the insulation resistance of the first conductor loop with respect to the electrically conductive medium is measured and/or determined. In this way, a control unit for a motor vehicle is provided, in which control unit a reduced adhesive bond between the encapsulation and the printed circuit board can be determined as early as during production of the control unit by measuring the insulation resistance between the first conductor loop and the second conductor loop or by measuring the insulation resistance of the first conductor loop with respect to the electrically conductive medium. Therefore, quality monitoring of the production process for the control units can be increased.

In some implementations, the first conductor loop and the second conductor loop are open and are each wired by a through-plating for a four-point resistance measurement, providing an advantage. In other words, both the first conductor loop and the second conductor loop have in each case contact points. These contact points are plated-through. This means that the contact points are plated-through or routed through the printed circuit board to a second side of the printed circuit board. The second side is different from the first side. The first side may be formed at a distance from the second side. The first side and the second side can be formed parallel to one another. The insulation resistance between the first conductor loop and the second conductor loop can be performed starting from the second side of the printed circuit board via the through-plating of the contact points of the first conductor loop and the second conductor loop. In this way, a weakening of the encapsulation on the first side for measuring the insulation resistance between the first conductor loop and the second conductor loop or for measuring the insulation resistance of the first conductor loop with respect to the electrically conductive medium can be avoided since the encapsulation is performed from the second side of the printed circuit board.

In some implementations, the printed circuit board has a second side which is arranged at a distance from the first side and is delimited by the edge, and a third conductor loop and a fourth conductor loop which is arranged at a distance from the third conductor loop are arranged on the second side. The third conductor loop is arranged between the edge and the fourth conductor loop. In other words, analogously to the first side, two conductor loops are formed on the second side. The two conductor loops are arranged next to one another, so that an insulation resistance between the conductor loops on the second side and/or between the third conductor loop and the electrically conductive medium can also be measured. The third conductor loop and the fourth conductor loop have contact points via which an electrical voltage can be applied to the respective conductor loop to measure the insulation resistance between the third conductor loop and the fourth conductor loop.

The distance between the first conductor loop which is arranged on the first side and the second conductor loop and/or between the third conductor loop which is arranged on the second side and the fourth conductor loop is greater than 100 μm and less than 750 μm, such as greater than 150 μm and less than 500 μm, where the limits are included. The distance between the first conductor loop and the second conductor loop can be different from the distance between the third conductor loop and the fourth conductor loop. However, it is also conceivable that the distance between the first conductor loop and the second conductor loop is equal to the distance between the third conductor loop and the fourth conductor loop.

In some examples, the first side and the second side of the printed circuit board are encapsulated. In other words, the first conductor loop which is arranged on the first side and the second conductor loop are encapsulated or overmolded, and the third conductor loop which is arranged on the second side and the fourth conductor loop are encapsulated or overmolded. The material for encapsulating the first side and the second side can be the same. However, it is also conceivable that the first side is encapsulated with a first material and the second side is encapsulated with a second material which is different from the first material.

In some implementations, the printed circuit board is arranged on the base plate via an intermediate layer, where the intermediate layer is arranged between the second side and the base plate, providing advantage. The intermediate layer can be formed as a thermally conductive adhesive and/or as a laminate and/or as a no-flow prepreg. The base plate can be formed from aluminum, so that heat can be dissipated via the base plate. The base plate can therefore also be regarded and/or formed as a heat sink.

In some examples, a recess and/or opening is arranged and/or formed in the base plate in such a way that contact points of the second conductor loop and/or contact points of a through-plating of the first conductor loop to the second side are accessible via the opening. This provides access to the contact points of the conductor loops, so that an electrical voltage can be applied to the contact points of the respective conductor loop in order to, for example, determine the insulation resistance between the first conductor loop and the second conductor loop and/or between the third conductor loop and the fourth conductor loop and/or between the first conductor loop and the electrically conductive medium and/or between the third conductor loop and the electrically conductive medium.

The contact points of the first conductor loop which is formed on the first side of the printed circuit board and the second conductor loop may be accessible from the first side to have an electrical voltage applied to them. For this purpose, the encapsulation is recessed in the region of the contact points of the first conductor loop and the second conductor loop on the first side of the printed circuit board, so that the contact points are accessible and can have an electrical voltage applied to them for a four-point resistance measurement.

In some implementations, contact points of the first conductor loop, the second conductor loop, the third conductor loop and/or the fourth conductor loop can have an electrical voltage applied to them/it via a plug-in connector and/or a plug of the printed circuit board in order to be able to determine and/or measure the insulation resistance between the respective adjacent conductor loops on one side of the printed circuit board. In this way, in addition to making electrical contact with the printed circuit board via the plug-in connector, electrical contact can also be made with the conductor loops.

In principle, the conductor loops can be designed to be conductive in such a way that an insulation resistance of the respective conductor loop can be measured, with respect to an electrically conductive medium and/or between the conductor loops of one side of the printed circuit board which are respectively arranged next to one another. In some examples, the first conductor loop and/or the second conductor loop and/or the third conductor loop and/or the fourth conductor loop contain/contains silver, brass, copper and/or a silver alloy. Copper is a good and inexpensive conductor of electricity, and therefore an electrical voltage can be applied to the respective conductor loop via the contact points of the respective conductor loop in order to be able to determine, for example, the insulation resistance between the respective conductor loops of one side of the printed circuit board. In addition, the costs for the control unit can be reduced since copper is an inexpensive conductor of electricity.

In some implementations, it is provided that a width and/or thickness of the first conductor loop, the second conductor loop, the third conductor loop and/or the fourth conductor loop is <500 μm, such as <250 μm and such as <100 μm, where the limits are included in each case.

In some examples, the control unit is formed without a housing. In other words, the printed circuit board with the electronic component arranged on it is not surrounded by a housing part, which has housing walls, in order to protect the electronic component from external influences, such as a corrosive medium for example. Rather, the control unit or the printed circuit board of the control unit with the electronic components arranged thereon is protected against external media by the encapsulation. Due to the design without a housing, both the production costs for the control unit and the installation space for the control unit can be reduced.

The invention additionally relates to a method for producing and measuring the tightness of the control unit, where the control unit is immersed in an electrically conductive medium, such an electrolyte solution, after it has been produced, and an insulation resistance between the first conductor loop and the second conductor loop and/or between the first conductor loop and the electrically conductive medium is measured.

In other words, the control unit is immersed in an electrically conductive medium, such as an electrolyte solution for example. In addition, for example, an electrical voltage is applied to the conductor loops of the first side and/or the second side in order to measure the insulation resistance between the respective conductor loops of the first side or the second side of the printed circuit board. It is also conceivable that an electrical voltage is applied to the first conductor loop or the third conductor loop in order to determine the insulation resistance between the first conductor loop and the electrically conductive medium and/or the third conductor loop and the electrically conductive medium. If the adhesive bond between the encapsulation and the printed circuit board is reduced, a gap can form between the encapsulation and the printed circuit board. This means that the electrolyte or the conductive medium can enter between the encapsulation and the printed circuit board via this gap. The electrically conductive medium or the electrolyte can penetrate into the gap in such a way that it electrically conductively connects the first conductor loop and the second conductor loop and/or the third conductor loop and the fourth conductor loop to one another, so that the insulation resistance between the respective conductor loops of one side of the printed circuit board is reduced. This is an indication that the adhesive bond between the encapsulation and the printed circuit board is reduced and the control unit should not be shipped. In this way, production errors can be detected at an early stage to separate out high-risk parts. Therefore, increased quality monitoring can be provided.

In some examples, the insulation resistance between the third conductor loop and the fourth conductor loop is measured. Depending on whether the insulation resistance on the first side or the second side of the printed circuit board is reduced, it is possible to determine exactly where the reduced adhesive bond is, in order to be able to make adjustments to the printed circuit board or to the base plate during the encapsulation.

It is also conceivable that the insulation resistance between the first conductor loop and the electrically conductive medium and/or between the third conductor loop and the electrically conductive medium is measured and/or determined.

In some examples, the insulation resistance between the first conductor loop and the second conductor loop and/or between the third conductor loop and the fourth conductor loop and/or between the first conductor loop and the electrically conductive medium and/or between the third conductor loop and the electrically conductive medium is determined during the immersion process or after the process of immersing the control unit in the electrically conductive medium or in the electrolyte solution. The insulation resistance between the conductor loops of one side of the printed circuit board or a conductor loop of the respective side with respect to the electrically conductive medium is determined during the immersion process. As an alternative, it can be provided that the insulation resistance between the conductor loops of the respective side or a conductor loop of the sides with respect to the electrically conductive medium is determined after the process of immersing the control unit in the electrically conductive medium or in the electrolyte solution. In this case, it is only necessary to ensure that the contact points or contact pads of the respective conductor loop are free of the electrolyte solution. This method is advantageous because it can be performed separately from the process of immersing the control unit in the electrically conductive medium.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
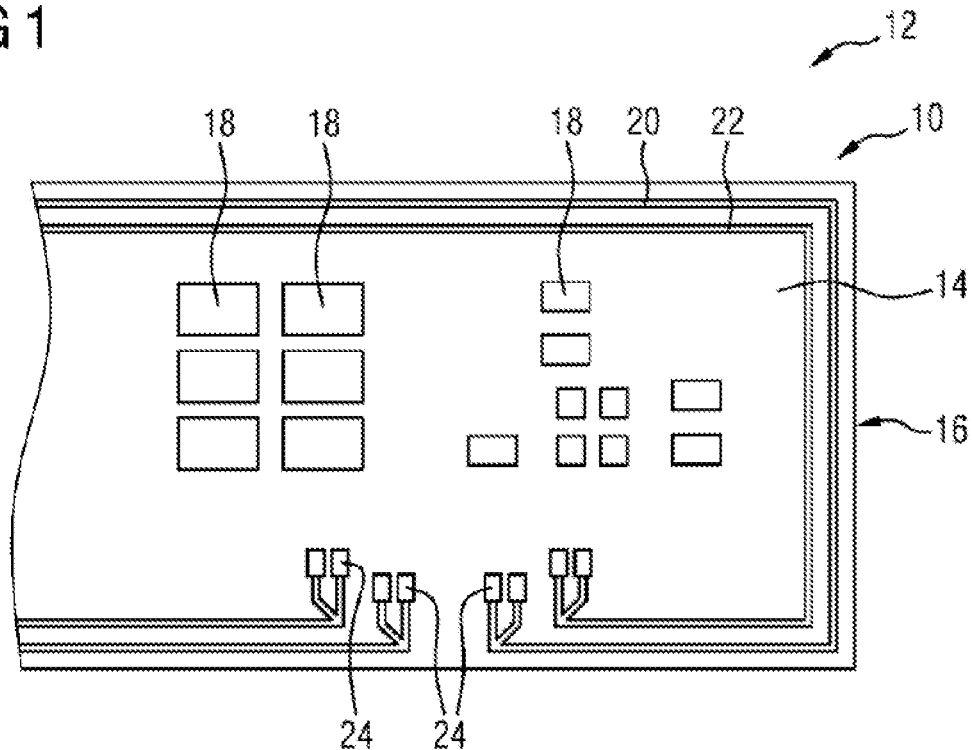
FIG. 1 shows a plan view of an exemplary printed circuit board of a control unit.

FIG. 1 shows a plan view of a printed circuit board 10 of a control unit 12 for a motor vehicle. The printed circuit board 10 has a first side 14 and an edge 16. The first side 14 is, for example, the top side of the printed circuit board 10. The edge 16 delimits the first side 14 of the printed circuit board 10 or the printed circuit board 10. In other words, the edge 16 is an outer border of the printed circuit board 10. A plurality of electronic components 18 are arranged on the first side 14 of the printed circuit board 10. The electronic components 18 are both mechanically and electrically conductively connected to the printed circuit board 10. Furthermore, it can be seen that a first conductor loop 20 and a second conductor loop 22 are arranged on the first side 14 of the printed circuit board 10, where the first conductor loop 20 is arranged between the edge 16 and the second conductor loop 22, and the second conductor loop 22 is arranged between the first conductor loop 20 and the electronic components 18. In other words, the two conductor loops 20, 22 are situated between the edge 16 and the electronic components 18, where the first conductor loop 20 is at a reduced distance from the edge 16 in comparison to the second conductor loop 22. Both the first conductor loop 20 and the second conductor loop 22 are formed in each case as an open conductor loop and have contact points 24 at their respective ends for applying an electrical voltage to the respective conductor loop 20, 22.

Figure 2:
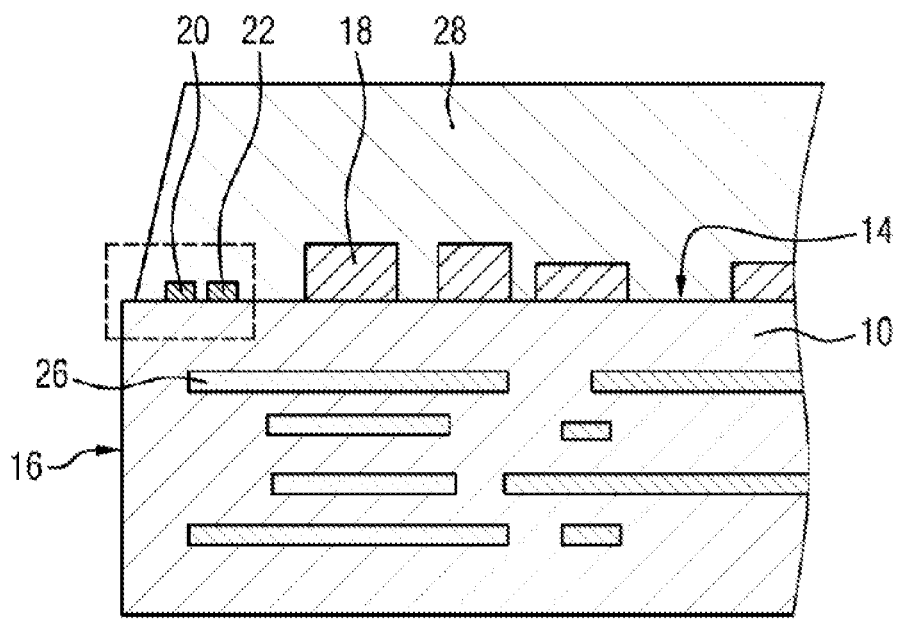
FIG. 2 shows a section through the printed circuit board of the control unit shown in FIG. 1.

FIG. 2 shows a section through the printed circuit board 10 of the control unit 12 shown in FIG. 1. The printed circuit board 10 is formed as a multilayer printed circuit board and has a plurality of conductor tracks 26, which are arranged at a distance from one another, in a direction perpendicular to the plane of the printed circuit board 10. The electronic components 18 are arranged on the first side 14 of the printed circuit board 10. The first conductor loop 20 is formed close to the edge 16 of the first side 14 of the printed circuit board 10. The second conductor loop 22 is arranged at a distance from the first conductor loop 20 on the first side 14 of the printed circuit board 10, where the second conductor loop 22 is at a greater distance from the edge 16 of the printed circuit board 10 than the first conductor loop 20. An encapsulation 28 is arranged on the first side 14 of the printed circuit board 10 The encapsulation 28 is also referred to as an "overmold". The encapsulation 28 is formed in such a way that at least the electronic components 18, the first conductor loop 20 and the second conductor loop 22 are encapsulated on the first side 14 of the printed circuit board 10. The encapsulation 28 can be, for example, a plastic, a synthetic resin, or a resin. In this way, a contact-making connection with the electronic components 18 on the printed circuit board 10 can be protected against external media. The conductor loops 20, 22 are likewise protected against external media.

The first conductor loop 20 is at a reduced distance from the edge 16 in comparison to the second conductor loop 22. The first conductor loop 20 and the second conductor loop 22 are at a distance from one another in a direction parallel to the plane of the printed circuit board 10. The encapsulation is formed between the first conductor loop 20 and the second conductor loop 22 and is also routed to the first side 14 of the printed circuit board 10.

To check the adhesive bond between the encapsulation 28 and the printed circuit board 10, the control unit 12 or the encapsulated printed circuit board 10 is immersed in a conductive medium, such as an electrolyte solution. If the adhesive bond between the encapsulation 28 and the printed circuit board 10 is reduced, a gap forms between the encapsulation 28 and the first side 14. The conductive medium can enter this gap. If the gap is formed in such a way that it leads to the second conductor loop 22, the conductive medium enters the gap and establishes a conductive connection between the first conductor loop 20 and the second conductor loop 22. If the insulation resistance between the first conductor loop 20 and the second conductor loop 22 is then measured and if this insulation resistance is reduced, this is an indication that the adhesive bond between the encapsulation 28 and the printed circuit board 10 is reduced or damaged. The reduced insulation resistance is therefore an indication that the control unit 12 should be separated out. Therefore, quality monitoring of the encapsulation can be ensured.

Figure 3:
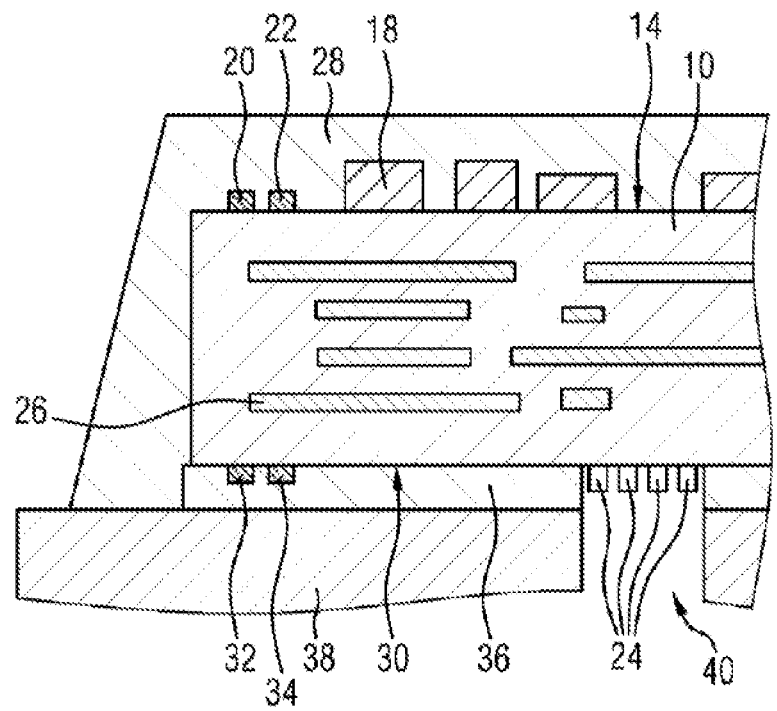
FIG. 3 shows an exemplary longitudinal section through the printed circuit board of the control unit.

FIG. 3 shows a section through the printed circuit board 10 known from FIG. 2, where the printed circuit board 10 has a second side 30 which is arranged at a distance from the first side 14. A third conductor loop 32 and a fourth conductor loop 34 are arranged at a distance from one another on the second side 30. The third conductor loop 32 is arranged and/or formed between the fourth conductor loop 34 and the edge 16 of the printed circuit board 10. The third conductor loop 32 and the fourth conductor loop 34 are each formed as open conductor loops and have corresponding contact points on the second side 30 for applying an electrical voltage to the respective conductor loop 32, 34 in order to measure the insulation resistance between the conductor loops 32, 34 of the second side 30.

The printed circuit board 10 is cohesively arranged on a base plate 38 via an intermediate layer 36 which may be formed as a thermally conductive adhesive. The base plate 38 may be formed from aluminum and serves as a heat sink for the control unit 12. Furthermore, it can be seen that the first conductor loop 20 and the second conductor loop 22 have a through-plating, so that the connection contacts or contact points of the first conductor loop 20 and the second conductor loop 22 are routed from the first side 14 of the printed circuit board 10 to the second side 30 of the printed circuit board 10. The base plate 38 has an opening 40 which is arranged and/or formed in such a way that the contact points 24 are exposed. This provides access to the contact points 24 via the opening 40 in order to apply an electrical voltage to the first conductor loop 20 and the second conductor loop 22 in order to detect or to measure the insulation resistance between the two conductor loops 20, 22 on the first side 14 of the printed circuit board 10. Although not shown, the contact points of the third conductor loop 32 and the fourth conductor loop 34 are also accessible via the opening 40 in order to apply an electrical voltage to the conductor loops 32, 34 of the second side 30 in order to detect or to measure the insulation resistance between the two conductor loops 32, 34 which are arranged on the second side 30.

Figure 4:
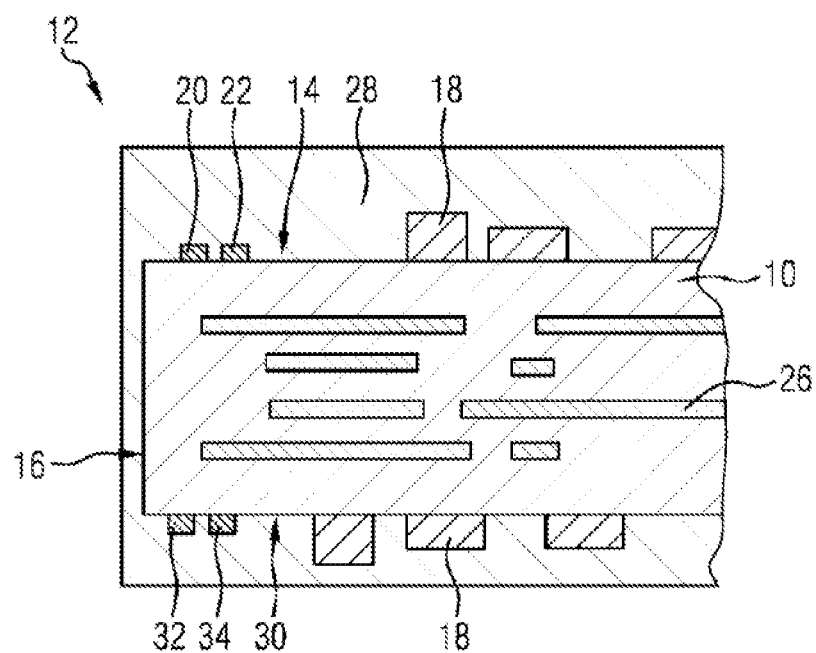
FIG. 4 shows an exemplary longitudinal section through the printed circuit board of the control unit.

FIG. 4 shows another example of a longitudinal section through the printed circuit board 10. The printed circuit board 10 has in each case a plurality of electronic components 18 both on the first side 14 and on the second side 30. The first conductor loop 20 and the second conductor loop 22 are arranged on the first side 14 at a distance from the edge 16. The first conductor loop 20 is at a reduced distance from the edge 16 in comparison to the second conductor loop 22. The distance between the first conductor loop 20 and the second conductor loop 22 may be 500 μm.

The third conductor loop 32 and the fourth conductor loop 34 are arranged on the second side 30 at a distance from the edge 16, where the distance between the third conductor loop 32 and the edge 16 is smaller than the distance between the fourth conductor loop 34 and the edge 16. The distance between the third conductor loop 32 and the fourth conductor loop 34 may be 500 μm. Both the first side 14 and the second side 30 of the printed circuit board 10 are protected against external media by an encapsulation 28. The contact points 24 of the first conductor loop 20, the second conductor loop 22, the third conductor loop 32 and the fourth conductor loop 34 can have an electrical voltage applied to them via a plug-in connector (not shown) of the printed circuit board 10 in order to be able to detect and/or determine the insulation resistance of the conductor loops.

Figure 5:
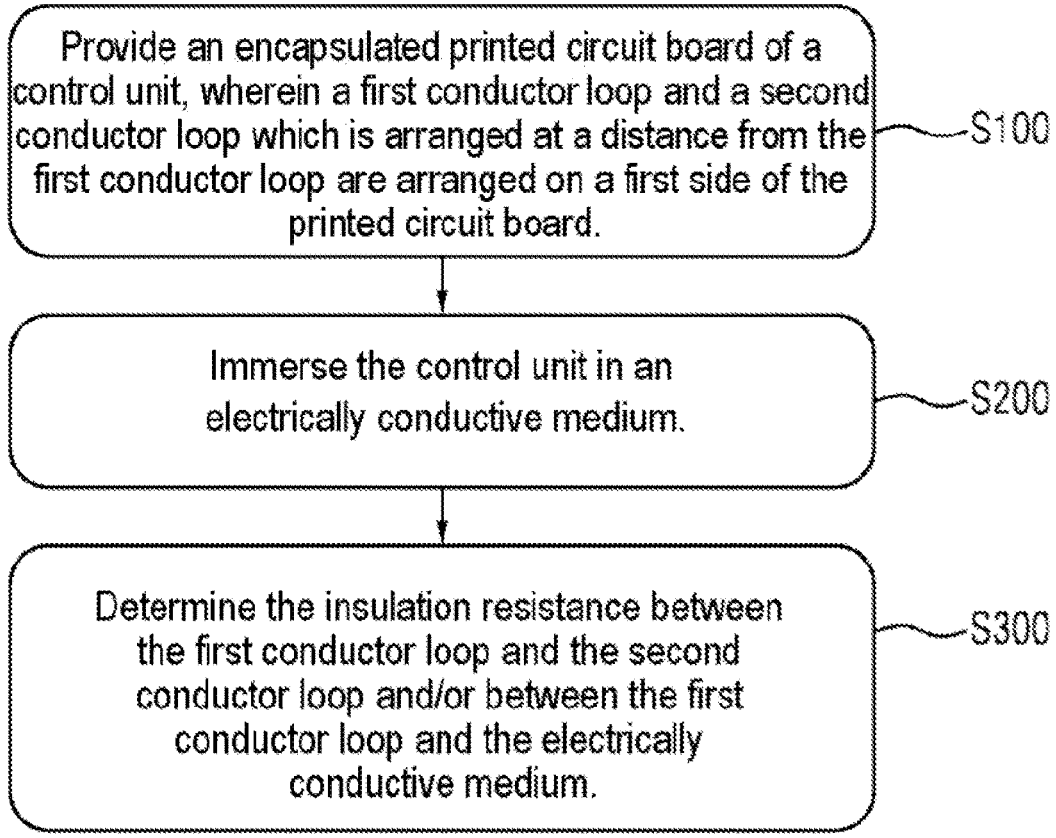
FIG. 5 shows a method for determining the insulation resistance.

FIG. 5 shows a method for measuring the tightness of a control unit. In a first step S100, an encapsulated printed circuit board 10 of a control unit 12 is provided. A first conductor loop 20 and a second conductor loop 22 which is arranged at a distance from the first conductor loop 20 are arranged on a first side 14 of the printed circuit board 10.

In a second step S200, the control unit 12 or the encapsulated printed circuit board 10 is immersed in an electrically conductive medium, for example an electrolyte liquid.

In a third step S300, the insulation resistance between the first conductor loop 20 and the second conductor loop 22 is determined. If the insulation resistance between the first conductor loop 20 and the second conductor loop 22 is reduced or equal to zero, this is an indication that the adhesive bond between the encapsulation 28 and the printed circuit board 10 is reduced, and the electrolyte has entered via a gap which is formed between the encapsulation 28 and the first side 14 of the printed circuit board 10. It is also conceivable that the insulation resistance between the first conductor loop 20 and the electrically conductive medium is determined.

Therefore, a method is provided with which the adhesive bond of an encapsulation 28 of a control unit 12 without a housing can be checked in a simple manner. The risk of faulty control units 12 being shipped can therefore be reduced as early as during the production process.

A number of implementations have been described. Nevertheless, it will be understood that various modifications may be made without departing from the spirit and scope of the disclosure. Accordingly, other implementations are within the scope of the following claims.

What is claimed is:

1. A control unit for a motor vehicle, the control unit comprising:
    a printed circuit board having a first side, a second side, and an edge, the first side of the printed circuit board is delimited by the edge, the second side of the printed circuit board is arranged at a distance from the first side and delimited by the edge;
    at least one electronic component arranged on the first side of the printed circuit board and electrically conductively connected to the printed circuit board;
    at least one first conductor loop arranged on the first side of the printed circuit board;
    at least one second conductor loop arranged at a distance from the first conductor loop, wherein the first conductor loop is arranged between the edge and the second conductor loop, and the second conductor loop is arranged between the first conductor loop and the at least one electronic component;
    a third conductor loop and a fourth conductor loop arranged at a distance from the third conductor loop, the third conductor loop and the fourth conductor loop are arranged on the second side of the printed circuit board, the third conductor loop is arranged between the edge and the fourth conductor loop; and
    an encapsulation of the printed circuit board, the encapsulation surrounding at least the first side, the at least one electronic component, the first conductor loop and the second conductor loop.

2. The control unit of claim 1, wherein the first conductor loop and the second conductor loop are open and are each wired by a through-plating for a four-point resistance measurement.

3. The control unit of claim 1, wherein the printed circuit board is arranged on a base plate via an intermediate layer, wherein the intermediate layer is arranged between the second side and the base plate.

4. The control unit of claim 3, further comprising an opening arranged and/or formed in the base plate in such a way that contact points of the third and the fourth conductor loop and/or, in a case of a through-plating of the first and the second conductor loop to the second side, contact points of the first and the second conductor loop are accessible via the opening.

5. The control unit of claim 1, wherein the first conductor loop and/or the second conductor loop and/or the third conductor loop and/or the fourth conductor loop contain/contains silver, brass, copper and/or a silver alloy.

6. The control unit of claim 1, wherein a width and/or thickness of the first conductor loop, the second conductor loop, the third conductor loop and/or the fourth conductor loop are/is less than 500 µm.

7. A method for producing and measuring a tightness of a control unit having a printed circuit board, the printed circuit board having a first side and an edge where the first side is delimited by the edge, at least one electronic component arranged on the first side of the printed circuit board and electrically conductively connected to the printed circuit board, the method comprising:
    immersing the control unit in an electrically conductive medium;
    measuring an insulation resistance between a first conductor loop and a second conductor loop, wherein the first conductive loop arranged on a first side of the printed circuit, the second conductor loop arranged at a distance from the first conductor loop, the first conductor loop is arranged between the edge and the second conductor loop, and the second conductor loop is arranged between the first conductor loop and the at least one electronic component, an encapsulation surrounds at least the first side, the at least one electronic component, the first conductor loop and the second conductor loop; and
    measuring an insulation resistance of the first conductor loop with respect to the electrically conductive medium is measured.

8. The method of claim 7, further comprising:
    measuring an insulation resistance between a third conductor loop and a fourth conductor loop; and/or
    measuring an insulation resistance of the third conductor loop with respect to the electrically conductive medium.

9. The method of claim 8, wherein the insulation resistance between the first conductor loop and the second conductor loop and/or between the third conductor loop and the fourth conductor loop and/or the insulation resistance between the first conductor loop and the electrically conductive medium and/or the insulation resistance between the third conductor loop and the electrically conductive medium are/is determined during the immersion process or after the process of immersing the control unit in the electrically conductive medium.

10. A motor vehicle comprising a control unit of claim 1.

* * * * *